United States Patent
Wu

(10) Patent No.: US 9,818,970 B2
(45) Date of Patent: Nov. 14, 2017

(54) ORGANIC LIGHT EMITTING DIODE DISPLAY PANEL, MANUFACTURING METHOD THEREOF AND MASK PLATE

(71) Applicants: BOE TECHNOLOGY GROUP CO., LTD., Beijing (CN); ORDOS YUANSHENG OPTOELECTRONICS CO., LTD., Ordos (CN)

(72) Inventor: Haidong Wu, Beijing (CN)

(73) Assignees: BOE TECHNOLOGY GROUP CO., LTD., Beijing (CN); ORDOS YUANSHENG OPTOELECTRONICS CO., LTD., Ordos (CN)

( * ) Notice: Subject to any disclaimer, the term of this patent is extended or adjusted under 35 U.S.C. 154(b) by 260 days.

(21) Appl. No.: 14/436,382

(22) PCT Filed: Sep. 2, 2014

(86) PCT No.: PCT/CN2014/085757
§ 371 (c)(1),
(2) Date: Apr. 16, 2015

(87) PCT Pub. No.: WO2015/192479
PCT Pub. Date: Dec. 23, 2015

(65) Prior Publication Data
US 2016/0260923 A1    Sep. 8, 2016

(30) Foreign Application Priority Data

Jun. 17, 2014    (CN) .......................... 2014 1 0271091

(51) Int. Cl.
*H01L 51/52*    (2006.01)
*H01L 51/00*    (2006.01)
(Continued)

(52) U.S. Cl.
CPC ........ *H01L 51/5225* (2013.01); *H01L 27/326* (2013.01); *H01L 27/3211* (2013.01);
(Continued)

(58) Field of Classification Search
CPC . H01L 51/5225; H01L 51/56; H01L 51/0014; H01L 27/326
See application file for complete search history.

(56) References Cited

U.S. PATENT DOCUMENTS 7,868,330 B2    1/2011 Lee
2004/0233360 A1    11/2004 Yoshida et al.
(Continued)

FOREIGN PATENT DOCUMENTS

CN    1773718 A    5/2006
CN    101924125 A    12/2010
(Continued)

OTHER PUBLICATIONS

Written Opinion of the International Searching Authority for International Application No. PCT/CN2014/085757.
(Continued)

*Primary Examiner* — Joseph L Williams
(74) *Attorney, Agent, or Firm* — Harness, Dickey & Pierce, P.L.C.

(57) ABSTRACT

The present disclosure provides an OLED display panel, a manufacturing method thereof and a mask plate. The OLED display panel includes an emitting layer and a cathode located at a light-exiting side of the emitting layer. The cathode is provided with gaps. Light emitted from the emitting layer may directly transmit through positions corresponding to the gaps, and then the cathode may have a decreased absorption and reflection against light emitted from the emitting layer as comparing with a cathode formed as a whole layer in the related art, thereby improving the
(Continued)

light extracting rate of the OLED display panel, weakening the micro-cavity effect and solving the problem that the display color of the OLED display panel changes with different viewing angles.

11 Claims, 8 Drawing Sheets

(51) Int. Cl.
　　*H01L 27/32* (2006.01)
　　*H01L 51/56* (2006.01)
(52) U.S. Cl.
　　CPC ...... *H01L 51/0014* (2013.01); *H01L 51/5262* (2013.01); *H01L 51/5265* (2013.01); *H01L 51/56* (2013.01)

(56) References Cited

U.S. PATENT DOCUMENTS

2006/0028124 A1　2/2006　Chu et al.
2015/0303399 A1　10/2015　Cui et al.

FOREIGN PATENT DOCUMENTS

| CN | 102110707 A | 6/2011 |
| CN | 102456710 A | 5/2012 |
| CN | 103346271 A | 10/2013 |
| CN | 203895463 U | 10/2014 |
| EP | 1653517 A2 | 5/2006 |
| EP | 2264768 A2 | 12/2010 |
| JP | 2000133450 A | 5/2000 |

OTHER PUBLICATIONS

First Chinese Office Action regarding Application No. 2014102710912 dated Jun. 1, 2016. English translation provided by Dragon Intellectual Property Law Firm.
Third Office Action regarding Chinese Application No. 201410271091.2 dated May 12, 2017. Translation provided by Dragon Intellectual Property Law Firm.
Fourth Office Action regarding Chinese Application No. 201410271091.2, dated Sep. 15, 2017. Translation provided by Dragon Intellectual Property Law Firm.

ORGANIC LIGHT EMITTING DIODE DISPLAY PANEL, MANUFACTURING METHOD THEREOF AND MASK PLATE

CROSS-REFERENCE TO RELATED APPLICATIONS

This application is the U.S. national phase of PCT Application No. PCT/CN2014/085757 filed on Sep. 2, 2014, which claims a priority to Chinese Patent Application No. 201410271091.2 filed on Jun. 17, 2014, the disclosures of which are incorporated in their entirety by reference herein.

TECHNICAL FIELD

The present disclosure relates to the field of organic light emitting diode (OLED) display technology, in particular to an OLED display panel, a manufacturing method thereof and a mask plate.

BACKGROUND

Referring to FIG. 1, FIG. 1 is a schematic view showing a cross-portion of an OLED display panel in the related art, the OLED display panel mainly includes a base substrate 101, a reflective metal layer 102, an anode 103, a hole transport layer (HTL) 104, an emitting layer (EML) 105, an electron transport layer (ETL) 106, a semi-transparent metal cathode 107 and a light extraction layer 108. The hole transport layer 104, the emitting layer 105, the electron transport layer 106 and the metal cathode 107 are films manufactured by vacuum evaporation process. Mask plates used in the vacuum evaporation process include a fine metal mask (FMM) and an open mask. Usually, the metal cathode 107 is vacuum-evaporated by using the open mask, thereby to obtain a metal cathode formed as a whole layer.

Since the metal cathode has strong absorption and strong reflection against light, thus there is a great loss of light in an OLED display panel including the metal cathode formed as a whole layer, resulting in a very low light extracting rate (referring to FIG. 2), arrows in the figure represent directions of light. In addition, since the metal cathode has strong reflection against light, thus a micro-cavity effect is formed in the OLED display panel. One defect of the micro-cavity effect is that display color changes significantly with different viewing angles.

SUMMARY

In view of this, the present disclosure provides an organic light emitting diode (OLED) display panel, a manufacturing method thereof and a mask plate, so as to solve the problems that the existing OLED display panel has a low light extracting rate and the display color of the existing OLED display panel changes with different viewing angles.

In order to solve the above technical problems, the present disclosure provides an organic light emitting diode (OLED) display panel, including an emitting layer and a cathode located at a light-exiting side of the emitting layer; the emitting layer includes a plurality of subpixels; the cathode is provided with gaps for improving transmittance of light emitted from the emitting layer.

Alternatively, the cathode includes at least two cathode units arranged at intervals; the gaps are defined between the cathode units.

Alternatively, the gaps between the cathode units correspond to gaps between the subpixels, and the gaps between the cathode units each have a width smaller than or equal to a width of the gaps between the corresponding subpixels.

Alternatively, the plurality of subpixels is arranged at intervals along a line direction of the display panel; the at least two cathode units are arranged at intervals along the line direction of the display panel; and each of the cathode units corresponds to at least one column of the subpixels.

Alternatively, the plurality of subpixels is arranged at intervals along a line direction of the display panel; the cathode units are arranged at intervals along a column direction of the display panel; each of the cathode units corresponds to at least one line of the subpixels.

Alternatively, the cathode units each are of a bar-like shape.

Alternatively, the cathode unit includes a plurality of subpixel-coverage portions and a narrowing portion for connecting adjacent subpixel-coverage portions; each of the subpixel-coverage portions corresponds to one or more of the subpixels, the narrowing portion has a width smaller than a width of the subpixel-coverage portions.

Alternatively, all the cathode units are connected as a whole by a connection line located outside a display region.

The present disclosure further provides in one embodiment a mask plate for manufacturing a cathode of an organic light emitting diode (OLED) display panel, including a transmitting area and a shielding area; when the mask plate is used with negative photoresist, a pattern of the transmitting area corresponds to a pattern of cathode units of the cathode, and a pattern of the shielding area corresponds to a pattern of gaps between the cathode units; or when the mask plate is used with positive photoresist, a pattern of the shielding area corresponds to a pattern of cathode units of the cathode, and a pattern of the transmitting area corresponds to a pattern of gaps between the cathode units.

The present disclosure further provides in one embodiment a method for manufacturing an organic light emitting diode (OLED) display panel, including a step of manufacturing a cathode using the above mask plate. The step includes:

placing a cathode material in an evaporation source within a vacuum chamber;

arranging the mask plate at one side of a substrate close to the evaporation source; and evaporating the cathode material by the evaporation source, so that the cathode material is gasified and escaped from the evaporation source, reaches a surface of the substrate to be plated and is condensed to form the cathode.

The above technical solutions of the present disclosure have following advantageous effects.

The cathode of the OLED display panel is provided with gaps, light emitted from the emitting layer of the OLED display panel may directly transmit through positions corresponding to the gaps, and then the cathode may have a decreased absorption and a decreased reflection against light emitted from the emitting layer as comparing with the cathode formed as a whole layer in the related art, thereby improving the light extracting rate of the OLED display panel, weakening the micro-cavity effect and solving the problem that the display color of the OLED display panel changes with different viewing angles.

DETAILED DESCRIPTION

Figure 1:
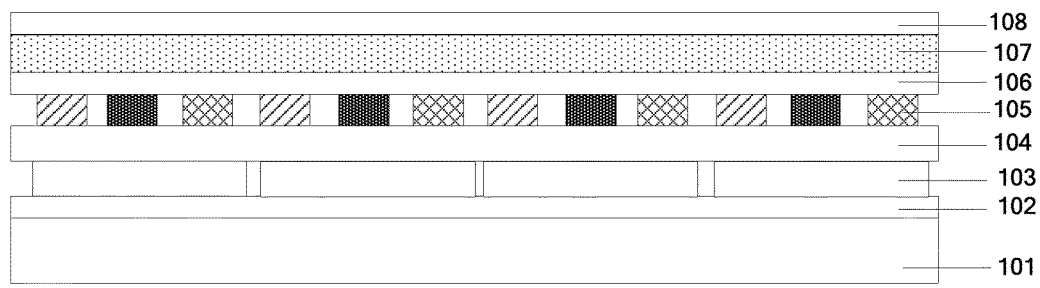
FIG. 1 is a schematic view showing a cross-portion of an OLED display panel in the related art.
Figure 2:
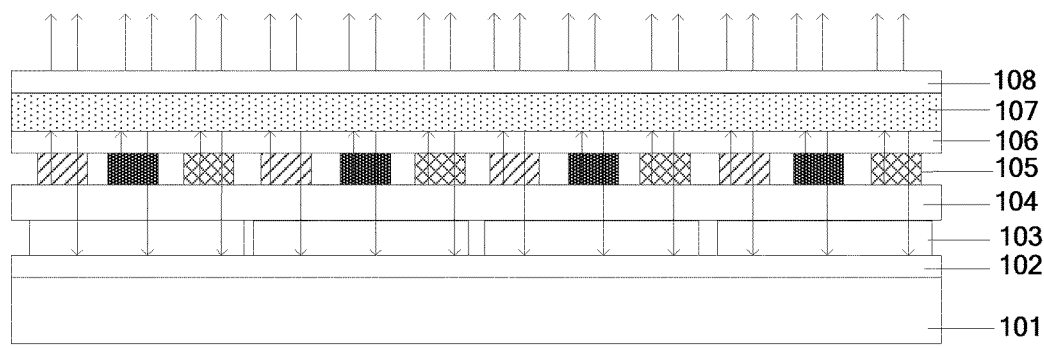
FIG. 2 is a diagram showing light paths of light emitted from an emitting layer of the OLED display panel in FIG. 1.

In order to solve the problems that the existing OLED display panel has a low light extracting rate and the display color of the existing OLED display panel changes with different viewing angles, the present disclosure provides in one embodiment an organic light emitting diode (OLED) display panel. The OLED display panel includes an emitting layer and a cathode located at a light-exiting side of the emitting layer. The cathode is provided with gaps for improving transmittance of light emitted from the emitting layer.

Light emitted from the emitting layer may directly transmit through positions corresponding to the gaps, and then the cathode may have a decreased absorption and a decreased reflection against light emitted from the emitting layer as comparing with the cathode formed as a whole layer in the related art, thereby improving the light extracting rate of the OLED display panel, weakening the micro-cavity effect, and solving the problem that the display color of the OLED display panel changes with different viewing angles.

The cathode according to embodiments of the present disclosure may be of various kinds of structures, as long as the cathode is provided with the above gaps.

Alternatively, the cathode includes at least two cathode units arranged at intervals, and the gaps are defined between the cathode units.

Alternatively, the gaps between cathode units correspond to gaps between the subpixels, and the gaps between the cathode units each have a width smaller than or equal to a width of the gaps between the corresponding subpixels, so as to guarantee injecting electrons to the emitting layer regularly.

Alternatively, the plurality of cathode units is arranged in a matrix manner, being as an N×M matrix, where N is a positive integer greater than 1, and M is also a positive integer greater than 1.

Alternatively, the plurality of subpixels is arranged at intervals along a line direction of the display panel; the at least two cathode units are arranged at intervals along the line direction of the display panel; each of the cathode units corresponds to at least one column of the subpixels.

Or, the plurality of subpixels is arranged at intervals along the line direction of the display panel; the plurality of cathode units is arranged at intervals along a column direction of the display panel; each of the cathode units corresponds to at least one line of the subpixels.

Alternatively, the cathode units each are of a bar-like shape; of course, the cathode units may also be of other shapes.

The cathode according to embodiments of the present disclosure may be a semi-transparent metal cathode.

Besides the emitting layer and the cathode, the OLED display panel according to the above embodiments of the present disclosure may also include a base substrate, a reflective metal, an anode, a hole transport layer, an electron transport layer and a light transport layer, etc.

The anode according to one embodiment of the present disclosure may be of a dot-like structure.

In order to make the technical problems to be solved, the technical solutions and the advantages of the present disclosure more apparent, a detailed description will be given hereinafter in conjunction with the drawings and embodiments.

First Embodiment

Figure 3:
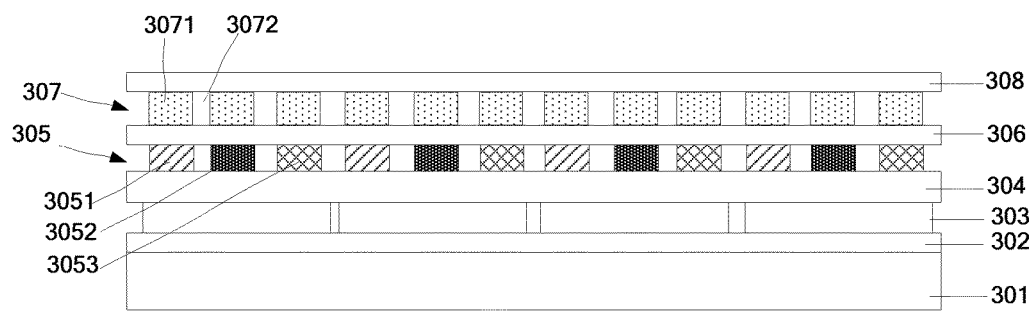
FIG. 3 is a schematic view showing a cross-portion of an OLED display panel according to a first embodiment of the present disclosure.

Referring to FIG. 3, FIG. 3 is a schematic view showing a cross-portion of an OLED display panel according to the first embodiment of the present disclosure.

The OLED display panel of the present embodiment of the present disclosure includes a base substrate 301, a reflective metal layer 302, an anode 303, a hole transport layer 304, an emitting layer 305, an electron transport layer 306, a cathode 307 and a light extraction layer 308. In some other embodiments of the present disclosure, some of the above layers are not necessary, such as the reflective metal layer 302 and the light extraction layer 308.

The emitting layer 305 includes three subpixels (a red subpixel 3051, a green subpixel 3052 and a blue subpixel 3053). In some other embodiments of the present disclosure, the subpixels are not limited to the red subpixel, the green subpixel and the blue subpixel; and the number of the subpixels is also not limited to three.

Figure 4:
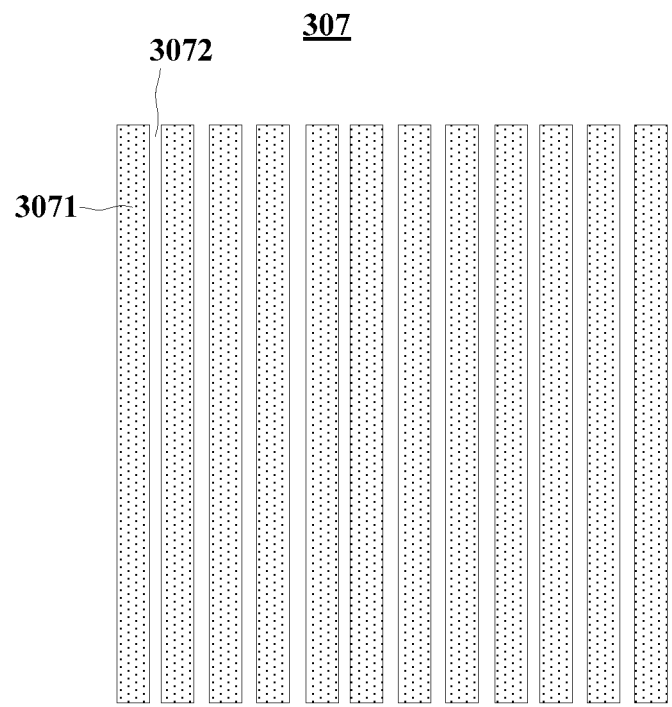
FIG. 4 is a schematic view showing a cathode of the OLED display panel in FIG. 3.

Also referring to FIG. 4, FIG. 4 is a schematic view showing the cathode of the OLED display panel in FIG. 3.

The cathode 307 includes a plurality of cathode units 3071 arranged at intervals, and gaps 3072 defined between the cathode units 3071 and configured to improve transmittance of light emitted from the light emitting layer.

In the present embodiment, the plurality of cathode units 3071 located within a display region is connected as a whole by a connection line located outside the display region, and then connected to a driver circuit.

As can be seen from FIG. 4, in the present embodiment, the plurality of cathode units 3071 is arranged in a matrix manner, being as a 1×N matrix, where N is a positive integer greater than 1.

Figure 5:
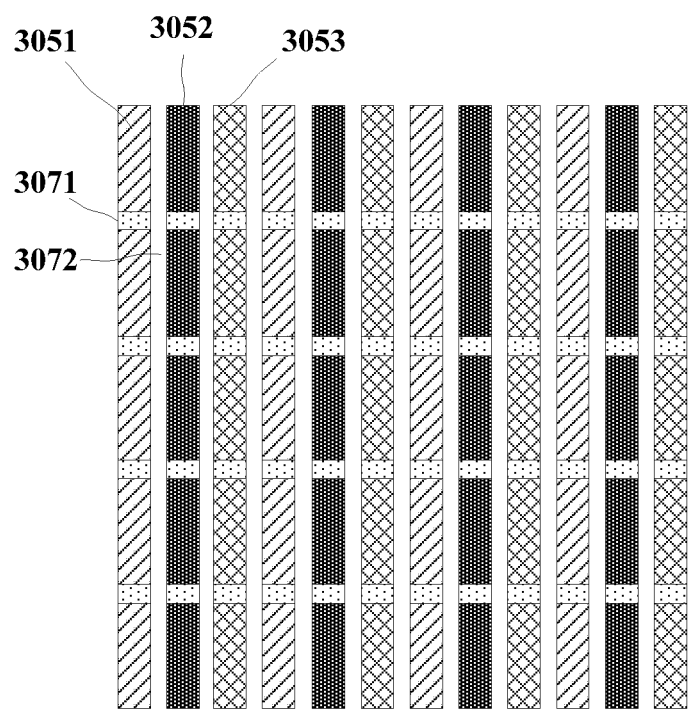
FIG. 5 is a top view showing the cathode and an emitting layer of the OLED display panel in FIG. 3.

Also referring to FIG. 5, FIG. 5 is a top view showing the cathode and the emitting layer of the OLED display panel in FIG. 3.

In the present embodiment, the red subpixel 3051, the green subpixel 3052 and the blue subpixel 3053 are arranged at intervals along a line direction of the display panel (hereinafter referred to as line direction). As can be seen from FIG. 3 and FIG. 5, the plurality of cathode units 3071 is also arranged at intervals along the line direction, each of the cathode units 3071 corresponds to one column of the subpixels. Each of the cathode units 3071 has a width in the line direction equal to a width of one corresponding column of the subpixels in the line direction, so that the cathode unit 3071 may completely cover the corresponding subpixels, thereby to guarantee injecting electrons to the emitting layer regularly.

Figure 6:
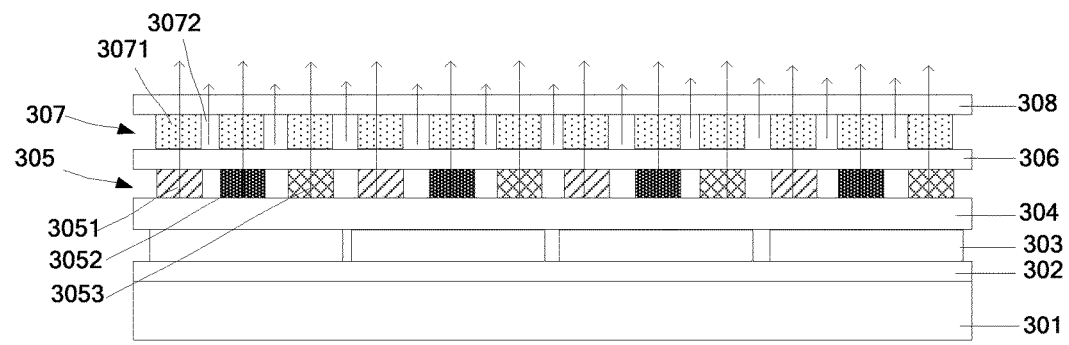
FIG. 6 is a diagram showing light paths of light emitted from the emitting layer of the OLED display panel according to the first embodiment of present disclosure.

Referring to FIG. 6, FIG. 6 is a diagram showing light paths of light emitted from the emitting layer of the OLED display panel according to the first embodiment of present disclosure. As can be seen from FIG. 6, light emitted from the emitting layer may directly transmit through positions corresponding to the gaps 3072, and then the cathode may have a decreased absorption and a decreased reflection against the light emitted from the emitting layer as comparing with the cathode formed as a whole layer in the related art, thereby improving the light extracting rate of the OLED display panel, weakening the micro-cavity effect and solving the problem that the display color of the OLED display panel changes with different viewing angles.

Second Embodiment

Figure 7:
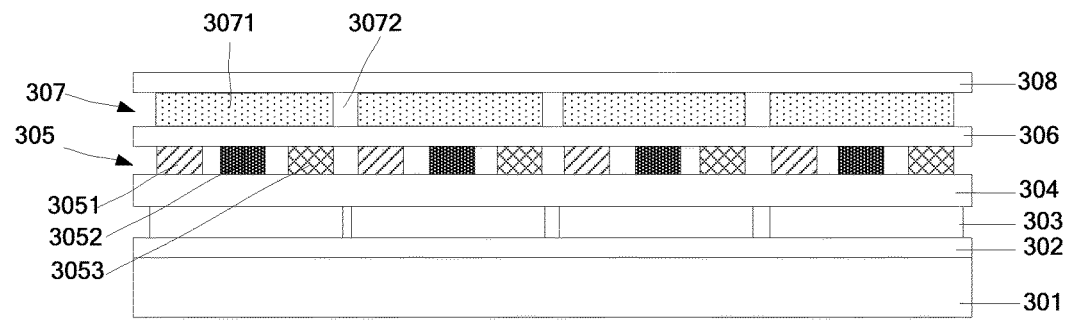
FIG. 7 is a schematic view showing a cross-portion of an OLED display panel according to a second embodiment of the present disclosure.
Figure 8:
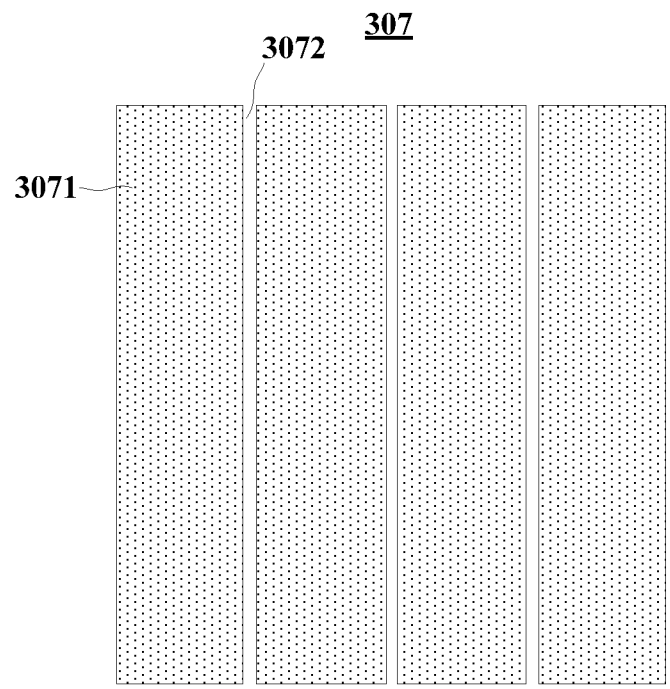
FIG. 8 is a schematic view showing a cathode of the OLED display panel in FIG. 7.
Figure 9:
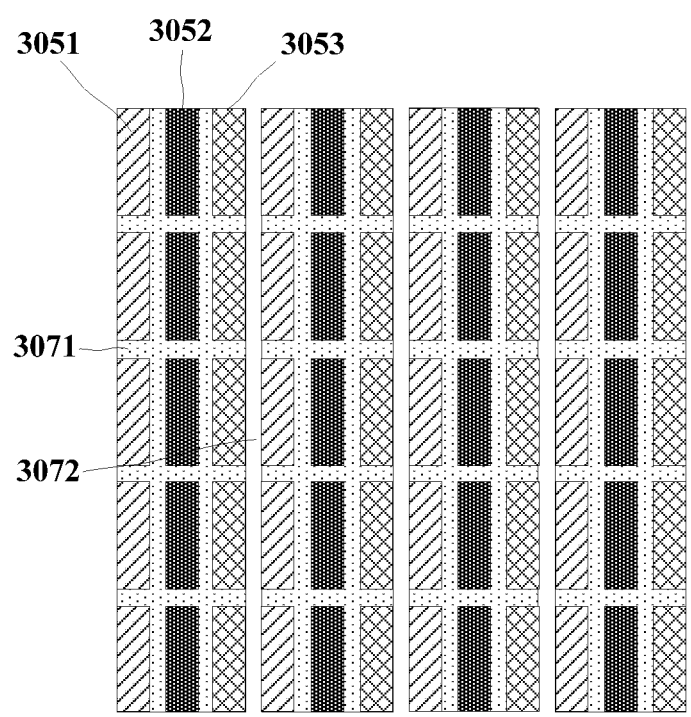
FIG. 9 is a top view showing the cathode and an emitting layer of the OLED display panel in FIG. 7.

Referring to FIGS. 7 to 9, FIG. 7 is a schematic view showing a cross-portion of the OLED display panel according to the second embodiment of the present disclosure; FIG. 8 is a schematic view showing a cathode of the OLED display panel in FIG. 7; FIG. 9 is a top view showing the cathode and an emitting layer of the OLED display panel in FIG. 7.

Differences between the present embodiment and the first embodiment lie in that each of the cathode units 3071 corresponds to three columns of the subpixels, and each of the cathode units 3071 has a width in the line direction equal to a width of three corresponding columns of the subpixels in the line direction.

In some other embodiments of the present disclosure, the number of columns of the subpixels corresponding to each cathode unit 3071 may also be other numbers, such as two columns, four columns.

In the above embodiments, the width of each cathode unit 3071 in the line direction is equal to the width of the corresponding subpixel(s) in the line direction; in some other embodiments of the present disclosure, each cathode unit 3071 may also have a width in the line direction greater than a width of the corresponding subpixel(s) in the line direction.

Third Embodiment

Figure 10:
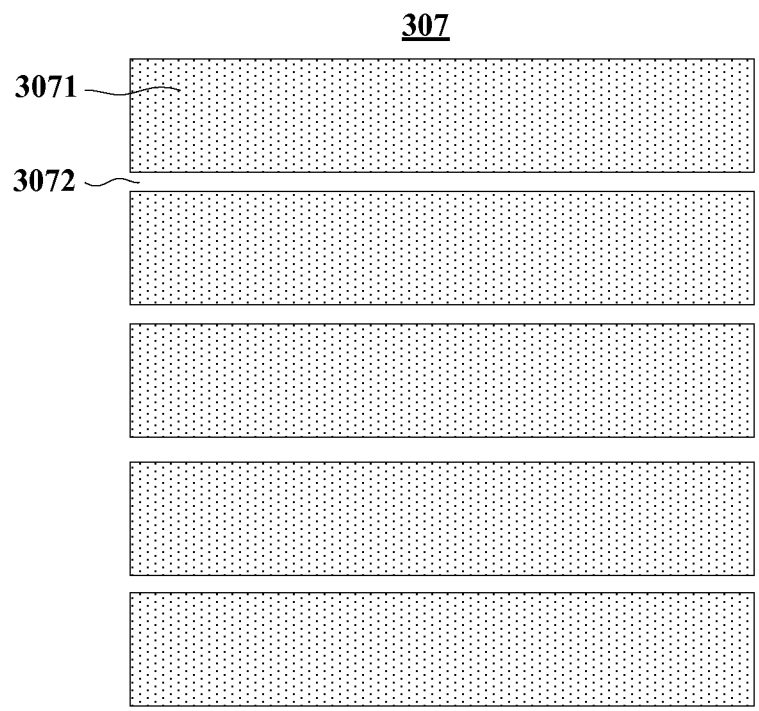
FIG. 10 is a schematic view showing a cathode of an OLED display panel according to a third embodiment of the present disclosure.
Figure 11:
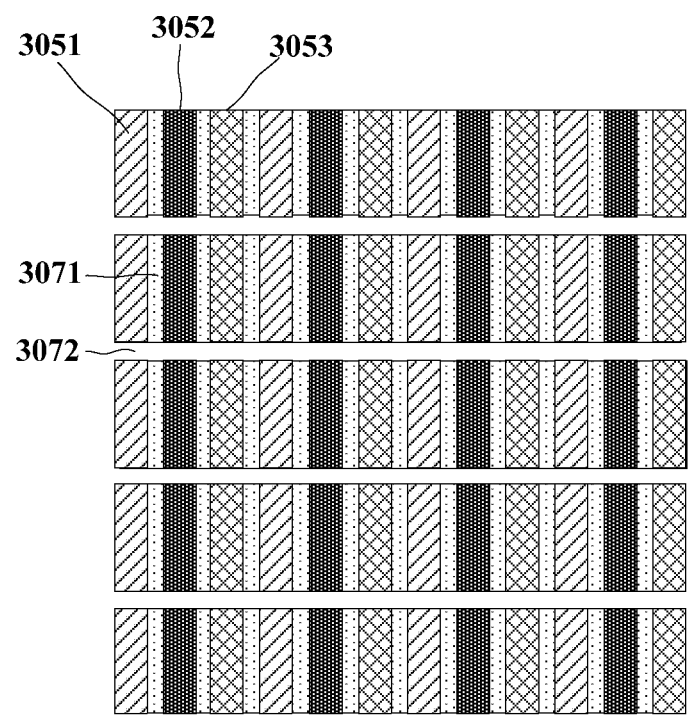
FIG. 11 is a top view showing the cathode and an emitting layer of the OLED display panel according to the third embodiment of the present disclosure.

Referring to FIGS. 10 and 11, FIG. 10 is a schematic view showing a cathode of an OLED display panel according to a third embodiment of the present disclosure, and FIG. 11 is a top view showing the cathode and an emitting layer of the OLED display panel according to the third embodiment of the present disclosure.

As can be seen from FIG. 10, the plurality of cathode units according to the present embodiment of the present disclosure is arranged in a matrix manner, being as an N×1 matrix, where N is a positive integer greater than 1.

As can be seen from FIG. 11, in the present embodiment of the present disclosure, the red subpixel 3051, the green subpixel 3052 and the blue subpixel 3053 are arranged at intervals in a line direction. The plurality of cathode units 3071 is arranged at intervals in a column direction of the display panel (hereinafter referred to as line direction). Each of the cathode units 3071 corresponds to one line of the subpixels. Each of the cathode units 3071 has a width in the column direction equal to a width of one corresponding line of subpixels in the column direction, so that the cathode unit 3071 may completely cover the corresponding subpixels, thereby to guarantee injecting electrons to the emitting layer regularly.

Fourth Embodiment

Figure 12:
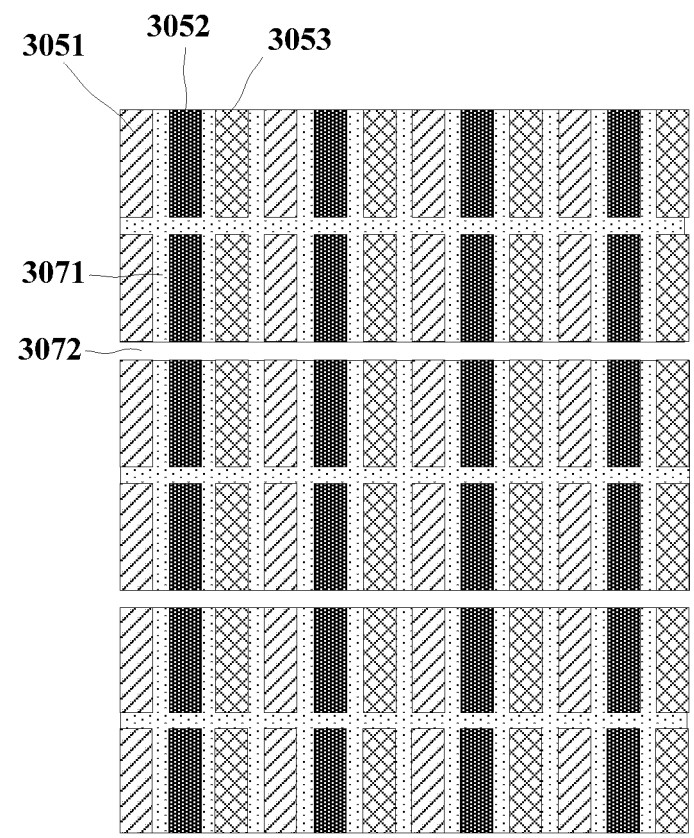
FIG. 12 is a top view showing a cathode and an emitting layer of an OLED display panel according to a fourth embodiment of the present disclosure.

Referring to FIG. 12, FIG. 12 is a top view showing a cathode and an emitting layer of the OLED display panel according to the fourth embodiment of the present disclosure. Differences between the present embodiment and the third embodiment lie in that: each of the cathode units 3071 corresponds to two lines of the subpixels, and each of the cathode units 3071 has a width in the column direction equal to a width of two corresponding lines of the subpixels in the column direction.

In some other embodiment of the present disclosure, the number of lines of the subpixels corresponding to each cathode unit 3071 may also be other numbers, such as three lines, four lines, or more lines.

In the above embodiments, the width of each cathode unit 3071 in the column direction is equal to the width of the corresponding subpixel(s) in the column direction; in some other embodiments of the present disclosure, each cathode unit 3071 may also have a width in the column direction greater than the width of the corresponding subpixel(s) in the column direction.

In the above embodiments, the plurality of subpixels is arranged at intervals along the line direction; or in some other embodiments of the present disclosure, the plurality of subpixels may also be arranged at intervals along the column direction.

In the above embodiments, all of the cathode units are of a regular bar-like shape, in some other embodiments of the present disclosure, the cathode units may also be of other shapes.

Fifth Embodiment

Figure 13:
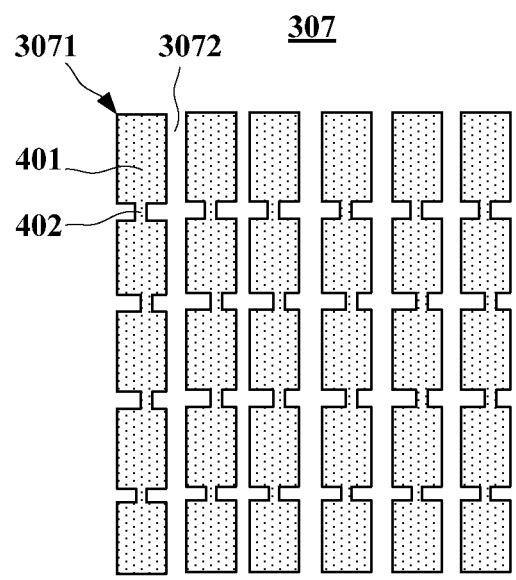
FIG. 13 is a schematic view showing a cathode of an OLED display panel according to a fifth embodiment of the present disclosure.

Referring to FIG. 13, FIG. 13 is a schematic view showing a cathode of an OLED display panel according to the fifth embodiment of the present disclosure. In the present embodiment, the cathode unit 3071, being of an irregular bar-like shape, includes a plurality of subpixel-coverage portions 401 and a narrowing portion 402 for connecting adjacent subpixel-coverage portions 401. Each subpixel-coverage portion 401 may correspond to one or more of the subpixels, and the narrowing portion 402 has a width smaller than a width of the subpixel-coverage portion 401.

In the present embodiment, the plurality of cathode units 3071 located within a display region is connected as a whole by a connection line located outside the display region, and then connected to a driver circuit.

Sixth Embodiment

Figure 14:
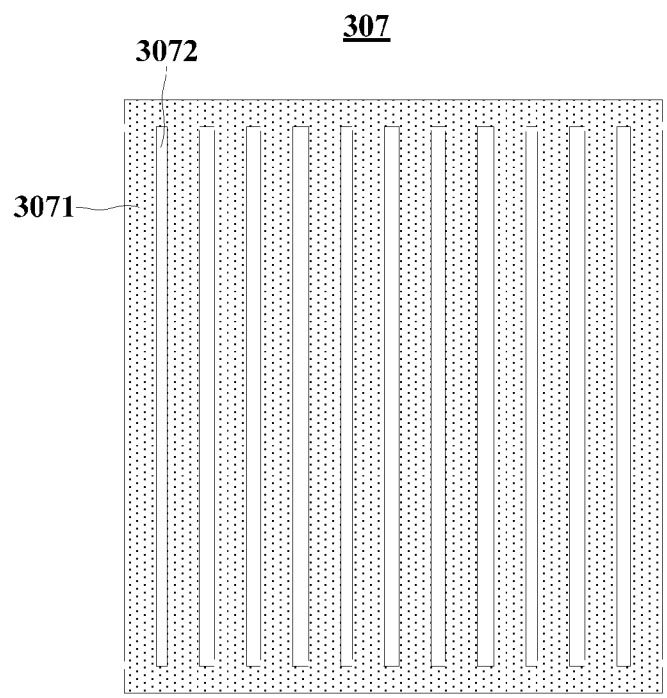
FIG. 14 is a schematic view showing a cathode of an OLED display panel according to a sixth embodiment of the present disclosure.

Referring to FIG. 14, FIG. 14 is a schematic view showing a cathode of an OLED display panel according to the sixth embodiment of the present disclosure. In the present embodiment, the cathode units 3071 are connected in the display region; in the case of such structure, it is unnecessary that each cathode unit 3071 is connected to a connection line located outside the display region to form a whole and then connected to a driver circuit.

The present disclosure also provides in one embodiment a mask plate for manufacturing cathodes of the OLED display panels of the above embodiments. The mask plate includes a transmitting area and a shielding area. When the mask plate is used with negative photoresist, a pattern of the transmitting area corresponds to a pattern of cathode units of the cathode, and a pattern of the shielding area corresponds to a pattern of gaps between the cathode units. When the mask plate is used with positive photoresist, a pattern of the shielding area corresponds to a pattern of the cathode units of the cathode, and a pattern of the transmitting area corresponds to a pattern of gaps between the cathode units.

Description is given below by taking a mask plate being of negative photoresist as an example.

Figure 15:
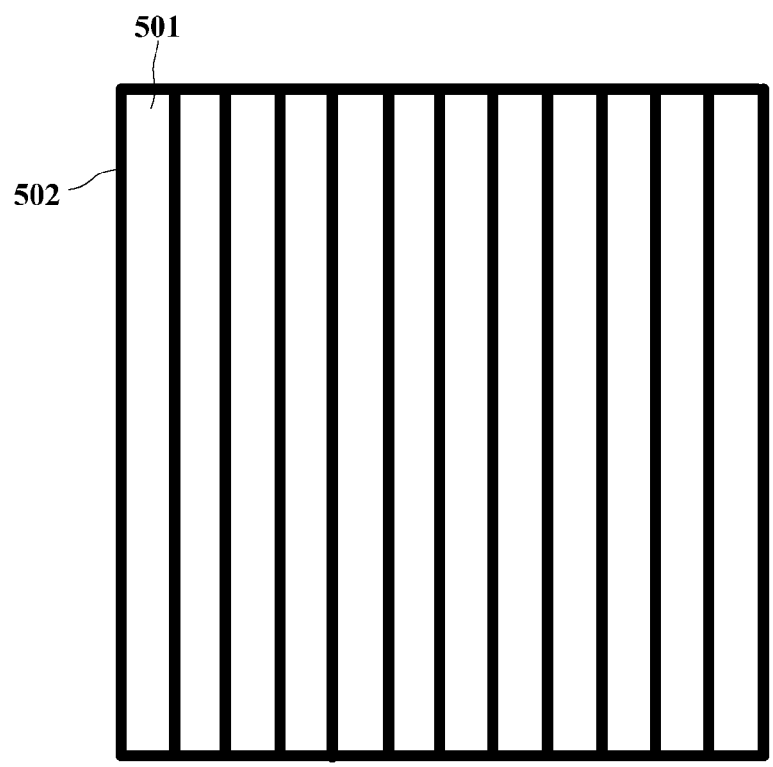
FIG. 15 is a schematic view showing a mask plate for manufacturing the cathode of the OLED display panel according to the first embodiment of the present disclosure.

Referring to FIG. 15, FIG. 15 shows a mask plate for manufacturing the cathode of the OLED display panel according to the first embodiment of the present disclosure. The mask plate includes a transmitting area 501 and a shielding area 502. A pattern of the transmitting area 501 corresponds to a pattern of the cathode units 3071 of the cathode, a pattern of the shielding area 502 corresponds to a pattern of the gaps 3072 between the cathode units 3071.

Figure 16:
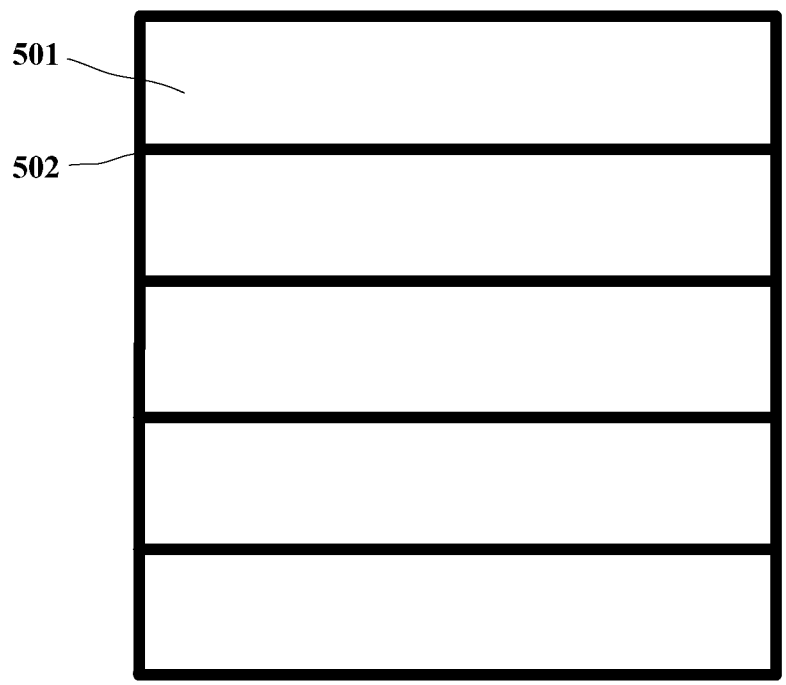
FIG. 16 is a schematic view showing a mask plate for manufacturing the cathode of the OLED display panel according to the third embodiment of the present disclosure.

Referring to FIG. 16, FIG. 16 shows a mask plate for manufacturing the cathode of the OLED display panel according to the third embodiment of the present disclosure. The mask plate includes a transmitting area 501 and a shielding area 502. A pattern of the transmitting area 501 corresponds to a pattern of the cathode units 3071 of the cathode, a pattern of the shielding area 502 corresponds to a pattern of the gaps 3072 between the cathode units 3071.

The present disclosure further provides in one embodiment a method for manufacturing an organic light-emitting diode (OLED) display panel, including a step of manufacturing a cathode by using the mask plate in the above embodiments. The method for manufacturing the OLED display panel adopts vacuum evaporation process to form the cathode.

Specifically, the step includes:

placing a cathode material in an evaporation source within a vacuum chamber;

arranging the mask plate at one side of a substrate close to the evaporation source; and evaporating the cathode material by the evaporation source so that the cathode material is gasified and escaped from the evaporation source, reaches a surface of the substrate to be plated and is condensed to form the cathode.

The above are merely optional embodiments of the present disclosure. It should be noted that, a person skilled in the art may further make improvements and modifications without departing from the principle of the present disclosure, and these improvements and modifications shall also be considered as the scope of the present disclosure.

What is claimed is:

1. An organic light emitting diode (OLED) display panel, comprising an emitting layer and a cathode located at a light-exiting side of the emitting layer; wherein the emitting layer comprises a plurality of subpixels, and the cathode is provided with gaps for improving transmittance of light emitted from the emitting layer, the cathode comprises at least two cathode units arranged at intervals, the cathode unit comprises a plurality of subpixel-coverage portions and a narrowing portion for connecting adjacent subpixel-coverage portions, each of the subpixel-coverage portions corresponds to one or more of the subpixels, and the narrowing portion has a width smaller than a width of the subpixel-coverage portions.

2. The OLED display panel according to claim 1, wherein the gaps are defined between the cathode units.

3. The OLED display panel according to claim 2, wherein the cathode units each are of a bar-like shape.

4. The OLED display panel according to claim 2, wherein all the cathode units are connected as a whole by a connection line located outside a display region.

5. The OLED display panel according to claim 2, wherein the plurality of subpixels is arranged at intervals along a line direction of the display panel; the at least two cathode units are arranged at intervals along the line direction of the display panel; and each of the cathode units corresponds to at least one column of the subpixels.

6. The OLED display panel according to claim 2, wherein the plurality of subpixels is arranged at intervals along a line direction of the display panel; the cathode units are arranged at intervals along a column direction of the display panel; and each of the cathode units corresponds to at least one line of the subpixels.

7. The OLED display panel according to claim 2, wherein the gaps between the cathode units correspond to gaps between the subpixels; and the gaps between the cathode units each have a width smaller than or equal to a width of the gaps between the corresponding subpixels.

8. The OLED display panel according to claim 7, wherein the plurality of subpixels is arranged at intervals along a line direction of the display panel; the cathode units are arranged at intervals along a column direction of the display panel; and each of the cathode units corresponds to at least one line of the subpixels.

9. The OLED display panel according to claim 7, wherein the plurality of subpixels is arranged at intervals along a line direction of the display panel; the at least two cathode units are arranged at intervals along the line direction of the display panel; and each of the cathode units corresponds to at least one column of the subpixels.

10. A mask plate for manufacturing a cathode of the organic light-emitting diode (OLED) display panel according to claim 1, comprising a transmitting area and a shielding area; wherein when the mask plate is used with negative photoresist, a pattern of the transmitting area corresponds to a pattern of cathode units of the cathode, and a pattern of the shielding area corresponds to a pattern of gaps between the cathode units; when the mask plate is used with positive photoresist, a pattern of the shielding area corresponds to a pattern of the cathode units of the cathode, and a pattern of the transmitting area corresponds to a pattern of the gaps between the cathode units.

11. A method for manufacturing an organic light emitting diode (OLED) display panel, comprising a step of manufacturing a cathode by using a mask plate, wherein the OLED display panel comprise an emitting layer and a cathode located at a light-exiting side of the emitting layer; wherein the emitting layer comprises a plurality of subpixels, and the cathode is provided with gaps for improving transmittance of light emitted from the emitting layer;

the mask plate comprises a transmitting area and a shielding area; wherein when the mask plate is used with negative photoresist, a pattern of the transmitting area corresponds to a pattern of cathode units of the cathode, and a pattern of the shielding area corresponds to a pattern of gaps between the cathode units; when the mask plate is used with positive photoresist, a pattern of the shielding area corresponds to a pattern of the cathode units of the cathode, and a pattern of the transmitting area corresponds to a pattern of the gaps between the cathode units;

wherein the step comprises:

placing a cathode material in an evaporation source within a vacuum chamber;

arranging the mask plate at one side of a substrate close to the evaporation source; and evaporating the cathode material by the evaporation source so that the cathode material is gasified and escaped from the evaporation source, reaches a surface of the substrate to be plated and is condensed to form the cathode.

* * * * *